United States Patent [19]

Krause

[11] 4,190,778
[45] Feb. 26, 1980

[54] A.C. SUPPLIED INTEGRATED SEMI-CONDUCTOR LOGIC CIRCUIT

[75] Inventor: Gerhard Krause, Rosenheim, Fed. Rep. of Germany

[73] Assignee: Siemens Aktiengesellschaft, Berlin & Munich, Fed. Rep. of Germany

[21] Appl. No.: 914,842

[22] Filed: Jun. 12, 1978

Related U.S. Application Data

[62] Division of Ser. No. 647,856, Jan. 9, 1976.

[51] Int. Cl.² .......................................... H03K 17/00
[52] U.S. Cl. .................................. 307/254; 307/210; 307/296 A; 307/315; 357/15; 357/36; 357/51; 357/58
[58] Field of Search .............. 307/254, 210, 296 A, 307/215, 106, 108; 357/15

[56] References Cited

U.S. PATENT DOCUMENTS

| | | | |
|---|---|---|---|
| 2,962,604 | 11/1960 | Brittain | 307/315 |
| 3,383,570 | 5/1968 | Luscher | 357/51 |
| 3,715,613 | 2/1973 | Beneking | 357/51 |
| 3,911,466 | 10/1975 | Lattin | 357/23 |
| 3,953,875 | 4/1975 | Cave et al. | 357/51 |
| 4,004,160 | 1/1977 | Streit et al. | 307/296 A |

OTHER PUBLICATIONS

I.B.M. Tech. Disclosure Bttn., Electronically Encodable Read-Only Store, by Abbas et al. vol. 13 No. 6, 11/70 p. 1428.

Primary Examiner—Stanley D. Miller, Jr.
Assistant Examiner—B. P. Davis
Attorney, Agent, or Firm—Hill, Van Santen, Steadman, Chiara & Simpson

[57] ABSTRACT

An integrated semiconductor circuit arrangement includes active and passive function elements in a semiconductor body and a high frequency a.c. voltage is used as a supply voltage for the function elements. A highly doped semiconductor substrate of one conductivity type carries a weakly doped layer, for example, of the same conductivity which has zones of the opposite conductivity therein. The substrate functions as an emitter for a plurality of transistors of which the doped zones serve as bases. Spaced co-planar layer sections bridge the base zones and serve as collectors. The collectors are either metal layers or semiconductor layers and in either case are covered with an insulating layer which carries a conductive layer for connection to a high frequency supply.

1 Claim, 4 Drawing Figures

4,190,778

A.C. SUPPLIED INTEGRATED SEMI-CONDUCTOR LOGIC CIRCUIT

This is a division, of application Ser. No. 647,856, filed Jan. 9, 1976.

BACKGROUND OF THE INVENTION

1. Field of the Invention

This invention relates to an integrated semiconductor circuit arrangement having active and passive elements in a semiconductor body, and is more particularly concerned with supplying an operating voltage to the elements in the form of a high frequency a.c. voltage.

2. Description of the Prior Art

In integrated semiconductor circuit arrangements previously known in the art, it is necessary to supply the supply voltage for the functional elements across contact electrodes which are arranged on the semiconductor body which contains the functional elements. Leading away from these contact electrodes are conductor paths which extend over the semiconductor body and serve to conduct the supply voltage to the functional elements which are arranged in the semiconductor body. For technological reasons, both the contact electrodes and the conductor paths require a specific amount of space which would not be necessary soley for the functional elements arranged in the semiconductor body. Therefore, the packing density of the functional elements in the semiconductor body is subject to a limit which is governed by the arrangement of the conductor paths on the semiconductor body.

SUMMARY OF THE INVENTION

The object of the present invention is to provide the possibility of supplying the voltage to the functional elements in integrated circuits which facilitates a considerably greater packing density of the functional elements.

The above object is realized in an integrated semiconductor circuit arrangement of the type generally described above, in accordance with the invention, in that a high frequency alternating voltage is used as a supply voltage for the functional elements.

Here, the high frequency alternating voltage can be, in particular, sinusoidal.

In accordance with another feature of the invention, for the supply of the high frequency alternating voltage, a metal electrode can be arranged on an insulating layer provided on the surface of the semiconductor body. In addition, a low ohmic, polycrystalline semiconductor layer or a blocking layer operated in the blocking direction, in the form of a pn junction or a Schottky contact can also serve for this purpose.

For an optimum exploitation of this method of voltage supply to the functional elements, it is advantageous to use structures which deviate from the known structures (planar structures) for transistor functional elements.

In accordance with an embodiment of the invention transistors are designed with the following structure. A highly doped substrate body of one conductivity type which acts as an emitter, carries a weakly doped or intrinsic layer arranged on the substrate body and spatially separate base zones of the other conductivity type are arranged in the weakly doped or intrinsic layer. Metal layers which are provided on the base zones and which is least partially cover the base zones each form a Schottky contact with a base zone and act as a collector.

In order to provide electrical connections between transistors designed in this manner, it is advantageous to conduct the metal layers which act as collectors at least in part over the weakly doped or intrinsic layer to an adjacent base zone to form an ohmic contact with the latter.

In accordance with another embodiment of the invention the transistors are designed to have the following structure. Again, a highly doped semiconductor body of one conductivity type which acts as an emitter carries a weakly doped or intrinsic layer having spatially separate base zones of the other conductivity type arranged therein. Other zones of the one conductivity type are located in the base zones and act as collectors.

Also in the last-mentioned embodiment of the transistors, the electrical connection of the transistors is advantageously effected by conducting the collector zones at least in part through the weakly doped or intrisic layer to an adjacent base zone to form, together with the latter, an ohmic contact which may be produced, for example, by strong doping of the two zones.

In accordance with a special embodiment of the invention, the base zones and the collector zones can be strip-shaped and can overlap in raster form.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
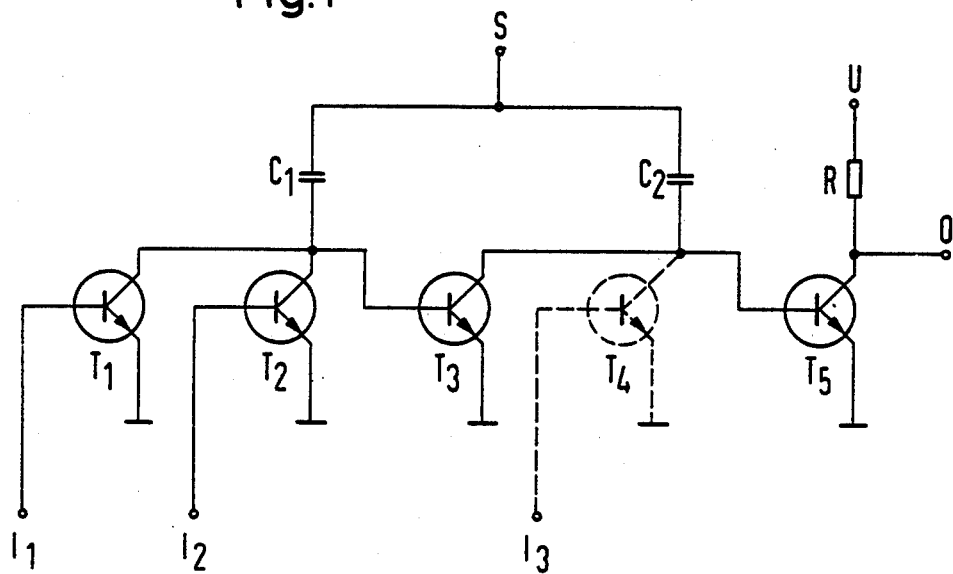
FIG. 1 is a schematic circuit diagram of a logic circuit constructed of transistors to aid in the explanation of the principle of voltage supply with a high frequency alternating voltage in accordance with the teachings of the present invention.

Referring to FIG. 1, a plurality of transistors $T_1$, $T_2$, $T_3$ and $T_5$ are operated in a grounded emitter configuration and are connected in cascade.

In order to illustrate that a circuit of this type can fundamentally be extended in an arbitrary fashion, another transistor $T_4$ is illustrated in broken lines as an additional transistor would be connected to the solidly shown portions of the circuit.

The collectors of the transistors $T_1$ and $T_2$, the base of the transistor $T_3$ (and, if added, also the collector of the transistor $T_4$), and the base of the transistor $T_5$ are supplied via a capacitance $C_1$, $C_2$ from a terminal S with a high frequency alternating voltage as a supply or feed voltage. In addition, the collector of the transistor $T_5$ is supplied via a load resistor R with a special supply d.c. voltage from a terminal U. The transistors $T_1$ and $T_2$ (and, if connected, also the transistor $T_4$) can be operated across their bases at respective terminals $I_1$, $I_2$ and $I_3$. A terminal O forms the output of the circuit.

In accordance with the invention, the terminal S is connected with a supply voltage which is a high frequency a.c. voltage in relation to ground, and which possesses, for example, a sinusoidal or rectangular wave and a frequency of 15 MHz at a voltage value of 5 V. During the positive half wave of the high frequency a.c. voltage, a current flows across the terminal S, via the capacitor $C_1$ and the base-emitter path of the transistor $T_3$ and across the capacitor $C_2$ and the base-emitter path of the transistor $T_5$, although because of the low ohmic value of the base-emitter paths, the voltage present across the collectors of the transistors is lower than the supply voltage. Therefore, the capacitances form high frequency current generators for the transistors.

If one of the transistors $T_1$ or $T_2$ connected to the terminals $I_1$ or $I_2$ is switched into the conductive state as a result of a positive control signal, the high frequency current flowing across the capacitor $C_1$ is short circuited by the collector-emitter path of the conductive transistor so that current can no longer flow into the base of the transistor $T_3$, i.e. the transistor $T_3$ is blocked. If the terminals $I_1$ and $I_2$ carry ground potential, in which case the transistors $T_1$ and $T_2$ are blocked, the positive half wave of the high frequency current flows across the base of the transistor $T_3$. In this case, the transistor $T_3$ is conductive, so that it short circuits the high frequency current flowing across the capacitor $C_2$. As the transistor $T_5$ which forms the last stage is operated with a special supply d.c. voltage of, e.g. 5 V, when the transistor $T_3$ is conductive, the supply voltage U is constantly connected to the output O. If, however, the transistor $T_3$ is blocked, the voltage connected to the output O fluctuates in the timing of the high frequency supply voltage between ground potential and the supply potential U. This high frequency output signal and a d.c. signal obtained from the latter by filtering are suitable to operate additional circuits.

Figure 2:
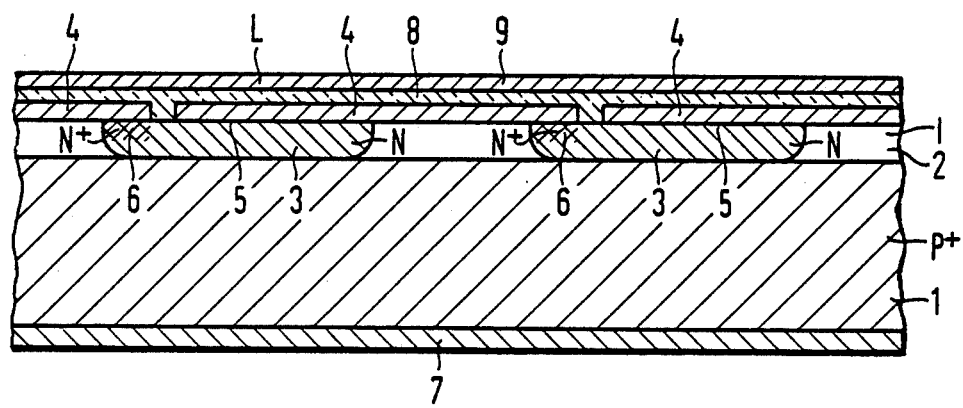
FIG. 2 is a cross-sectional view of a portion of an integrated semiconductor circuit arrangement constructed in accordance with a first embodiment of the invention.

The construction of the above-described circuit possibilities in the integrated technique will be explained in connection with the embodiments illustrated in FIGS. 2 and 3. Referring first to FIG. 2, a highly doped substrate body 1 of one conductivity type (for example p type) carries a weakly doped or self-conductive layer 2. Arranged in the layer 2 are zones 3 which possess the other conductivity type (for example n type) which are produced, for example, by diffusion. Metal coatings or layers 4 are applied to the surface of this semiconductor structure. The metal layers 4 form, on the one hand, Schottky contacts 5 in the large area covered portion of the zones 3, and, on the other hand, ohmic contacts 6 with the underlying zones 3. The ohmic contacts 6 are indicated by double shading in FIG. 2.

An insulating layer 8 is applied onto the structure of the semiconducting zones and metal layers and carries a metal electrode 9. A further metal electrode 7 is provided on the underneath side of the substrate body 1.

If the pn junction between the substrate body 1 and the zones 3 is operated in the forward direction and the Schottky contacts between the zones 3 and the metal layers 5 are operated in the blocking direction, the zone sequences operate as transistors with the substrate 1 serving as an emitter, the zones 3 serving as bases and the metal layers 4 serving as collectors.

In accordance with the description of the circuit illustrated in FIG. 1, a high frequency a.c. voltage is connected as a supply voltage to the metal electrode 9.

The integrated structure illustrated in FIG. 2 provides the advantage that capacitances, such as the capacitors $C_1$ and $C_2$ in FIG. 1, do not require to be additionally integrated. These capacitances are in fact formed by the insulating layer 8.

The ohmic contacts 6 also facilitate a connection between the collector of one transistor and the base of another transistor. The weakly doped or intrinsic layer 2 ensures insulation between the transistors. No additional insulation diffusion or insulation by means of oxide is necessary because the voltage which is to be insulated amounts to, at the maximum, 0.6 V (threshold voltage of the base-emitter diode) and because a considerable part of this voltage is intercepted by the potential barrier of the layer 2. Any insulation currents still flowing are negligible.

Figure 3:
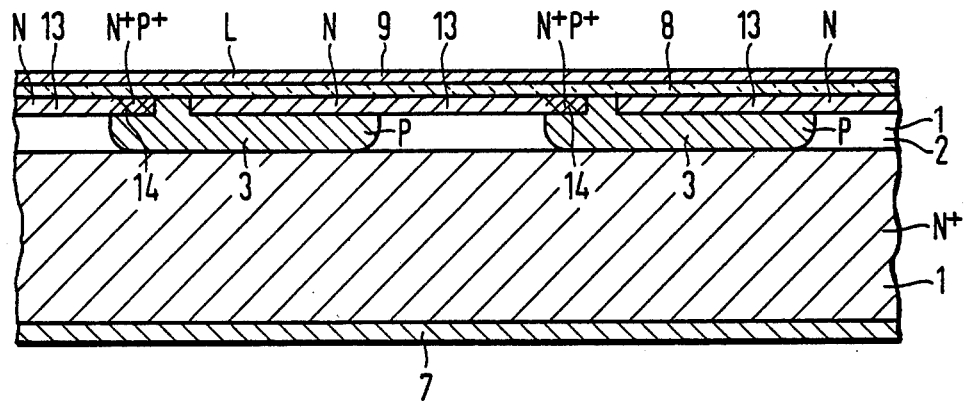
FIG. 3 is a cross-sectional view of an integrated semiconductor circuit arrangement constructed in accordance with a second embodiment of the invention.

FIG. 3, in which elements similar to those illustrated in FIG. 2 have been provided with like references, shows another embodiment of the transistor structures. Here, the emitter and base zones correspond to those illustrated in FIG. 2. The collectors, however, are here formed not by metal layers, but by semiconductor zones 13 (for example produced by diffusion), which are of the opposite conductivity type to the base zones 3. Ohmic contacts 14, which serve to electrically connect the individual transistors, are produced by a strong doping, which is again indicated by double shading.

When the conductivity types are appropriately selected, pnp transistors can be constructed, for example, with an arrangement such as that illustrated in FIG. 2, and npn transistors can be constructed with an arrangement such as that illustrated in FIG. 3.

The arrangement represented in FIG. 3 additionally possesses the advantage that the semiconductor body is not interrupted by metal paths, so that three-dimensional structures can also be realized with the described construction. Transistors of this type and the supply lines for the supply voltage can also be arranged one above another.

Figure 4:
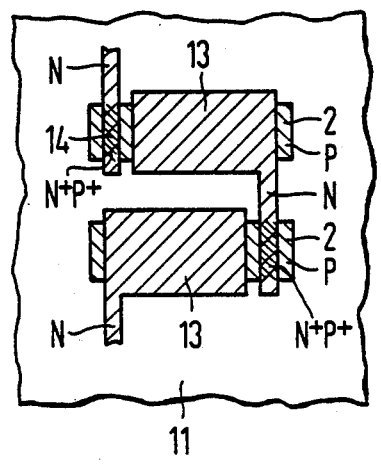
FIG. 4 is a plan view illustrating the strip-shaped base and collector zones for the apparatus illustrated in FIG. 3.

In accordance with FIG. 4, a transistor arrangement can be further simplified in that the bases and the collectors are designed in strip shape, a collector being formed where a strip 13 intersects with a strip 3 over a large area. The zones 14 again represent electrical connection points and base terminals. If necessary, a plurality of collector strips can also be conducted over a base strip. Here, large geometrical tolerances are permissable because the various zones are not internested as is the case with conventional transistors. Consequently, smaller transistor structures are achieved, which serves to further increase the packing density.

As only the positive half of the high frequency supply voltage can flow across the base of the transistors, it must be ensured that the same quantity of charge can also be discharged in the negative half wave in order that the arrangement does not become self-blocking as a result of the rectifier effect. In the arrangement illustrated in FIG. 4, this is ensured by the parallel resistance to the base-emitter path which occurs as a result of the lack of insulation, for example insulation diffusion. In the case of a small number of transistor stages connected in cascade, the charge in the negative half wave can flow across the collector-base paths biased in the direction of flow. It is also fundamentally possible to provide a diode which is connected in parallel to and inversely to the base-emitter path, which serves the same purpose. A diode of this type is not required for all the transistor stages. The principle of the invention can be applied to other components, for example field effect transistors.

In the case of a large number of stages, because of the finite signal transist time, it can be necessary to conduct the supply voltage to various stages with a differing phase state or frequency. Here, a three-phase system with a phase difference of 120° is of particular significance.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:
1. A circuit arrangement comprising:
   first, second, third and fourth transistors each including a base, an emitter and a collector,
   said emitters connected to a common reference potential,
   said bases of said first and second transistors adapted to receive d.c. logic control signals,
   said base of said third transistor connected to said collectors of said first and second transistors,
   said base of said fourth transistor connected to said collector of said third transistor,
   a resistor,
   said collector of said fourth transistor serving as an a.c. and d.c. output and connected to a d.c. supply potential via said resistor, and
   a.c. supply means adapted to receive a high frequency a.c. signal, said supply means connected to said collectors of said first, second and third transistors,
   blocking of said first and second transistors by said control signals causing conduction of said third transistor to shunt the a.c. signal from said fourth transistor to maintain it blocked and provide a d.c. output via the d.c. supply and said resistor,
   conduction of either of said first and second transistors shunting the a.c. signal from said third transistor causing conduction of said fourth transistor at the frequency of the a.c. signal to provide a d.c. and a.c. output.

* * * * *